(12) United States Patent
Cao et al.

(10) Patent No.: US 11,985,867 B2
(45) Date of Patent: May 14, 2024

(54) DISPLAY SUBSTRATE HAVING BRIDGE REGIONS WITH DIFFERENT STIFFNESS, DISPLAY PANEL AND DISPLAY APPARATUS

(71) Applicant: BOE TECHNOLOGY GROUP CO., LTD., Beijing (CN)

(72) Inventors: Fangxu Cao, Beijing (CN); Pinfan Wang, Beijing (CN); Jing Yang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 498 days.

(21) Appl. No.: 17/297,588

(22) PCT Filed: Jun. 18, 2020

(86) PCT No.: PCT/CN2020/096773
§ 371 (c)(1),
(2) Date: May 27, 2021

(87) PCT Pub. No.: WO2020/253768
PCT Pub. Date: Dec. 24, 2020

(65) Prior Publication Data
US 2022/0028945 A1 Jan. 27, 2022

(30) Foreign Application Priority Data
Jun. 21, 2019 (CN) .................... 201910541283.3

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
CPC .......................... H10K 59/124; H10K 59/131
(Continued)

(56) References Cited

U.S. PATENT DOCUMENTS

2011/0227078 A1 9/2011 Park et al.
2016/0320878 A1 11/2016 Hong et al.
(Continued)

FOREIGN PATENT DOCUMENTS

| CN | 109768052 | 5/2019 |
| CN | 110265423 | 9/2019 |
| WO | WO2011008459 | 1/2011 |

OTHER PUBLICATIONS

Chinese First Office Action (w/ English translation) for corresponding CN Application No. 201910541283.3, 13 pages.
(Continued)

*Primary Examiner* — Xia L Cross
(74) *Attorney, Agent, or Firm* — Dority & Manning, P.A.

(57) ABSTRACT

A display substrate has a plurality of pixel island regions arranged at intervals and a plurality of bridge regions connecting the plurality of pixel island regions, and includes an opening being disposed between any two adjacent bridge regions. At least one bridge region of the plurality of bridge regions including a first region and two second regions located on two sides of the first region, one second region of the two second regions being connected to one pixel island region adjacent thereto, and another region of the two second regions being connected to one pixel island region adjacent thereto. A stiffness of a portion of the display substrate located in the first region being less than a stiffness of a portion of the display substrate located in each second region.

17 Claims, 11 Drawing Sheets

(58) Field of Classification Search
USPC .......................................................... 257/40
See application file for complete search history.

(56) References Cited

U.S. PATENT DOCUMENTS

| 2019/0259825 A1 | 8/2019 | Hong et al. |
| 2021/0083211 A1* | 3/2021 | Park .................... H10K 59/123 |
| 2021/0208446 A1 | 7/2021 | Yang et al. |

OTHER PUBLICATIONS

PCT International Search Report (w/ English translation) for corresponding PCT Application No. PCT/CN2020/096773, mailed on Sep. 22, 2020, 5 pages.

* cited by examiner

DISPLAY SUBSTRATE HAVING BRIDGE REGIONS WITH DIFFERENT STIFFNESS, DISPLAY PANEL AND DISPLAY APPARATUS

CROSS-REFERENCE TO RELATED APPLICATIONS

This application is a national phase entry under 35 U.S.C. 371 of International Patent Application No. PCT/CN2020/096773 filed on Jun. 18, 2020, which claims priority to Chinese Patent Application No, 201910541283.3, filed on Jun. 21, 2019, which are incorporated herein by reference in their entirety.

TECHNICAL FIELD

The present disclosure relates to the field of display technologies, and in particular, to a display substrate, a display panel and a display apparatus.

BACKGROUND

A stretchable display apparatus is a new type of display apparatus that can be stretched under action of a pulling force to expand an area of the display apparatus. A display panel of the stretchable display apparatus is provided with a plurality of openings. The display panel is deformed at edges of the openings under the action of the pulling force, so as to achieve stretching of the stretchable display apparatus.

SUMMARY

In an aspect, a display substrate is provided, the display substrate has a plurality of pixel island regions arranged at intervals and a plurality of bridge regions connecting the plurality of pixel island regions. The display substrate includes an opening being disposed between any two adjacent bridge regions. At least one bridge region of the plurality of bridge regions includes a first region and two second regions located on two sides of the first region, one second region of the two second regions being connected to one pixel island region adjacent thereto, and another region of the two second regions being connected to one pixel island region adjacent thereto. A stiffness of a portion of the display substrate located in the first region is less than a stiffness of a portion of the display substrate located in each second region.

In some embodiments, a thickness of the portion of the display substrate located in the first region is less than a thickness of the portion of the display substrate located in the second region in a thickness direction of the display substrate.

In some embodiments, the first region includes a middle sub-region and two edge sub-regions located on two sides of the middle sub-region, one edge sub-region of the two edge sub-regions is connected to one second region, and another edge sub-region of the two edge sub-regions is connected to another second region. A thickness of a portion of the display substrate located in the middle sub-region is less than a thickness of a portion of the display substrate located in each edge sub-region. The thickness of the portion of the display substrate located in the edge sub-region is less than the thickness of the portion of the display substrate located in the second region.

In some embodiments, the first region further includes at least one transition sub-region located between the middle sub-region and the edge sub-region. In all transition sub-regions and the edge sub-region, thicknesses of portions of the display substrate located in sub-regions increase sequentially in a direction from the middle sub-region to the edge sub-region.

In some embodiments, the display substrate further includes: a base and an inorganic insulating layer disposed on the base. A thickness of a portion of the inorganic insulating layer located in the first region is less than a thickness of a portion of the inorganic insulating layer located in the second region.

In some embodiments, the inorganic insulating layer includes a plurality of sub-insulating layers stacked in a thickness direction of the base. In at least one sub-insulating layer of the plurality of sub-insulating layers, a thickness of a portion of each sub-insulating layer located in the first region is less than a thickness of a portion of the sub-insulating layer located in the second region.

In some embodiments, the inorganic insulating layer includes a plurality of sub-insulating layers stacked in a thickness direction of the base. In at least one sub-insulating layer of the plurality of sub-insulating layers, an orthogonal projection of each sub-insulating layer on the base overlaps the second region and does not overlap the first region.

In some embodiments, the display substrate further includes a plurality of pixel driving circuits disposed on the base and located in a pixel island region of the plurality of the pixel island regions. A pixel driving circuit of the plurality of pixel driving circuits includes a plurality of thin film transistors. A thin film transistor of the plurality of thin film transistors includes a gate, an active layer, a source, and a drain. The plurality of sub-insulating layers include a buffer layer, a gate insulating layer and a passivation layer. The buffer layer is disposed between the gate and the base, the gate insulating layer is disposed between the gate and the active layer, and the passivation layer is disposed on a side of the source and the drain away from the base.

In some embodiments, the gate is disposed on a side of the active layer away from the base. The plurality of sub-insulating layers further include an interlayer dielectric layer, and the interlayer dielectric layer is disposed a side of the gate away from the active layer.

In some embodiments, the display substrate further includes at least one signal line disposed in the bridge region, and the at least one signal line includes a gate line and/or a data line.

In some embodiments, the plurality of pixel island regions are arranged in an array. The plurality of bridge regions are divided into a plurality of groups of bridge regions, and each group of bridge regions includes one first bridge region, one second bridge region, one third bridge region, and one fourth bridge region. Each pixel island region is connected to one second region in a first bridge region, one second region in a second bridge region, one second region in a third bridge region, and one second region in a fourth bridge region that are in one group of bridge regions, the second region in the first bridge region and the second region in the second bridge region are located on two opposite sides of the pixel island region, and the second region in the third bridge region and the second region in the fourth bridge region are located on another two opposite sides of the pixel island region. Another second region in the first bridge region is connected to one pixel island region that is located on a first side of the four sides of and adjacent to the pixel island region, another second region in the second bridge region is connected to one pixel island region that is located on a second side of the four sides of and adjacent to the pixel island region, and the pixel island region, the pixel island region located on the first side of the pixel island region and the pixel island region located on the second side of the pixel island region are located in a same row of pixel island regions. Another second region in the third bridge region is connected to one pixel island region that is located on a third side of the four side of and adjacent to the pixel island region, another second region in the fourth bridge region is connected to one pixel island region that is located on a fourth side of the four side of and adjacent to the pixel island region, and the pixel island region, the pixel island region located on the third side of the pixel island region and the pixel island region located on the fourth side of the pixel island region are located in a same column of pixel island regions.

In some embodiments, the second region in the first bridge region and the second region in the second bridge region that are in the group of bridge regions are located on the two sides of the pixel island region in a column direction of the plurality of pixel island regions. The second region in the third bridge region and the second region in the fourth bridge region that are in the group of bridge regions are located on the second side and the first side of the pixel island region in a row direction of the plurality of pixel island regions, respectively.

In another aspect, a display panel including any one of the above display substrates and a plurality of light-emitting devices disposed in each pixel island region is provided.

In some embodiments, each light-emitting device includes any one of an organic light-emitting diode (OLED) device, a quantum dot light-emitting diode (QLED) device, and a Micro light-emitting device.

In yet another aspect, a display apparatus including the above display panel is provided.

In some embodiments, a surface of the display substrate in the first region includes two inclined surfaces forming an included angle with each other, or a surface of the display substrate in the first region is a curved surface.

In some embodiments, a surface of the display substrate in the bridge region is a curved surface.

In some embodiments, the display substrate further includes: a plurality of pixel driving circuits disposed on the base and located in a pixel island region of the plurality of the pixel island regions, and a pixel driving circuit of the plurality of pixel driving circuits including a plurality of thin film transistors. A thin film transistor of the plurality of thin film transistors includes a gate, an active layer, a source, and a drain. The plurality of sub-insulating layers include a buffer layer, a gate insulating layer and a passivation layer. The buffer layer is disposed between the gate and the base, the gate insulating layer is disposed between the gate and the active layer, and the passivation layer is disposed on a side of the source and the drain away from the base.

In some embodiments, the gate is disposed on a side of the active layer away from the base; and the plurality of sub-insulating layers further include an interlayer dielectric layer, and the interlayer dielectric layer is disposed a side of the gate away from the active layer.

In some embodiments, the second region in the first bridge region and the second region in the second bridge region that are in the group of bridge regions are located on the second side and the first side of the pixel island region in a row direction of the plurality of pixel island regions, respectively. The second region in the third bridge region and the second region in the fourth bridge region that are in the group of bridge regions are located on the fourth side and the third side of the pixel island region in a column direction of the plurality of pixel island regions, respectively.

BRIEF DESCRIPTION OF THE DRAWINGS

In order to describe technical solutions in the present disclosure more clearly, accompanying drawings to be used in the description of some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals to which the embodiments of the present disclosure relate.

DETAILED DESCRIPTION

The technical solutions in embodiments of the present disclosure will be described clearly and completely with reference to the accompanying drawings. Obviously, the described embodiments are merely some but not all of embodiments of the present disclosure. All other embodiments obtained on a basis of the embodiments of the present disclosure by a person of ordinary skill in the art without paying any creative effort shall be included in the protection scope of the present disclosure.

Unless the context requires otherwise, throughout the specification and the claims, the term "comprise" and other forms thereof such as the third-person singular form "comprises" and the present participle form "comprising" are construed as being open and inclusive, meaning "including, but not limited to." In the description of the specification, the terms "one embodiment", "some embodiments", "exemplary embodiments", "an example", "specific examples" "some examples" and the like are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Below, the terms "first", "second" and the like are merely used for descriptive purposes and are not to be construed as indicating or implying the relative importance or implicitly indicating the number of indicated technical features. Thus, features defined as "first", "second" may explicitly or implicitly include one or more of the features. In the description of the embodiments of the present disclosure, "a plurality of/the plurality of" means two or more unless otherwise specified.

In describing some embodiments, "connected" and its derivative expressions may be used. For example, the term "connected" may be used when describing some embodiments to indicate that two or more components are in direct physical contact or electrical contact with each other. However, the term "coupled" may also mean that two or more elements are not in direct contact with each other, but yet still co-operate or interact with each other. The embodiments disclosed herein are not necessarily limited to the content herein.

"At least one of A, B, and C" has the same meaning as "at least one of A, B, or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

Some embodiments of the present disclosure provide a display apparatus.

Figure 1:
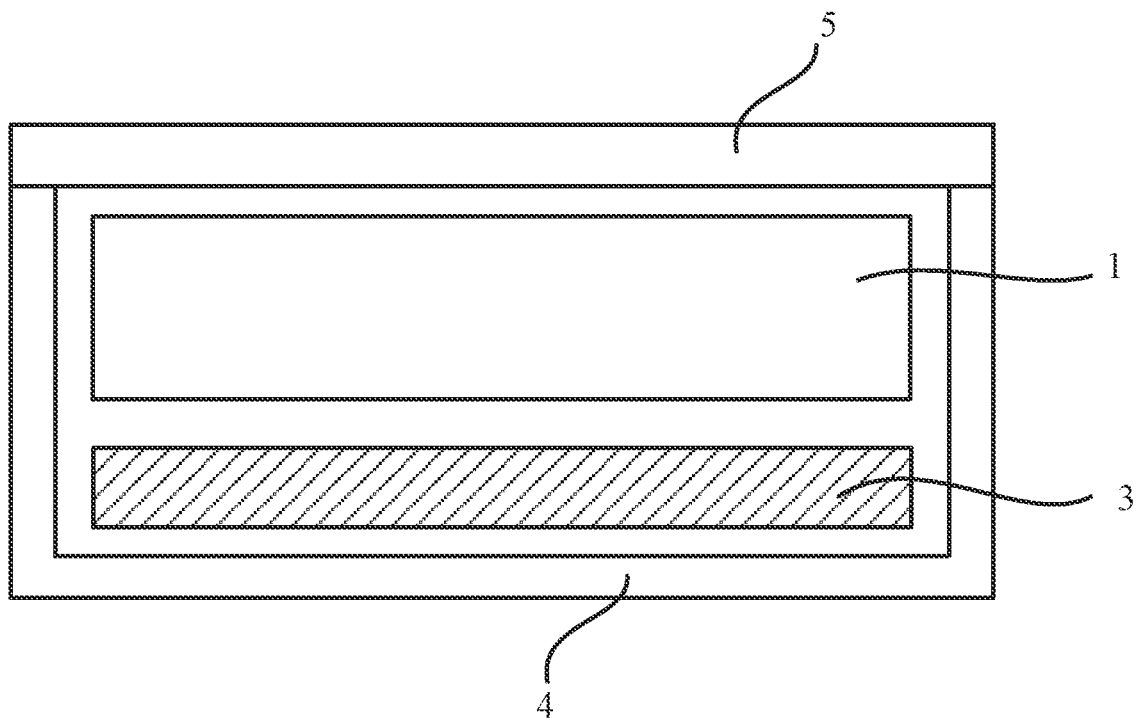
FIG. 1 is a schematic diagram showing a structure of a display apparatus, in accordance with some embodiments of the present disclosure.

As shown in FIG. 1, the display apparatus mainly includes a display panel 1, a circuit board 3, a frame 4, a cover glass 5 and other electronic accessories. The display panel 1 is a stretchable display panel.

A longitudinal section of the frame 4 has, for example, a U-shape, and the display panel 1, the circuit board 3 and other electronic accessories are disposed in a space between the frame 4 and the cover glass 5. The circuit board 3 is disposed on a side of the display panel 1 facing away from a light exiting surface of the display panel 1. The cover glass 5 is disposed on a side of the display panel 1 proximate to the light exiting surface of the display panel 1.

The circuit board 3 is configured to provide signals required for display to the display panel 1. For example, the circuit board 3 is a printed circuit board assembly (PCBA), the PCBA includes a printed circuit board (PCB), a timing controller (TCON), a power management integrated circuit (PMIC) and other integrated circuits (ICs) or circuits that are disposed on the PCB.

The display apparatus may include, but is not limited to, a cellphone, a tablet personal computer, a personal digital assistance (FDA) and a vehicle-mounted computer.

In some embodiments, the display panel is a self-luminescent display panel. For example, the display panel is an organic light-emitting diode (abbreviated as OLED) display panel, a quantum dot light-emitting diode (abbreviated as QLED) display panel, or a micro light-emitting diode (abbreviated as Micro-LED) display panel. Embodiments of the present disclosure do not limit a type of the display panel.

Figure 2A:
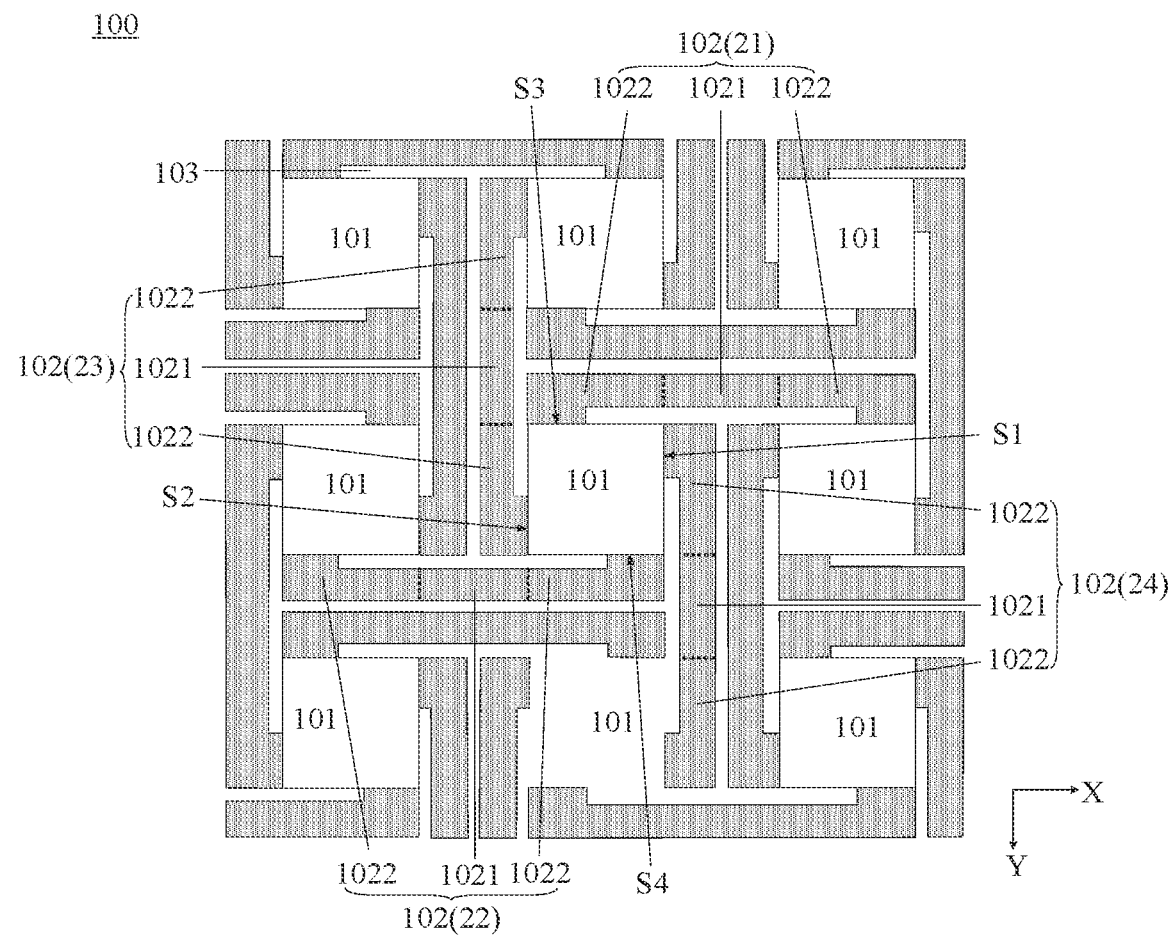
FIG. 2A is a schematic diagram showing a structure of a display substrate, in accordance with some embodiments of the present disclosure.
Figure 2B:
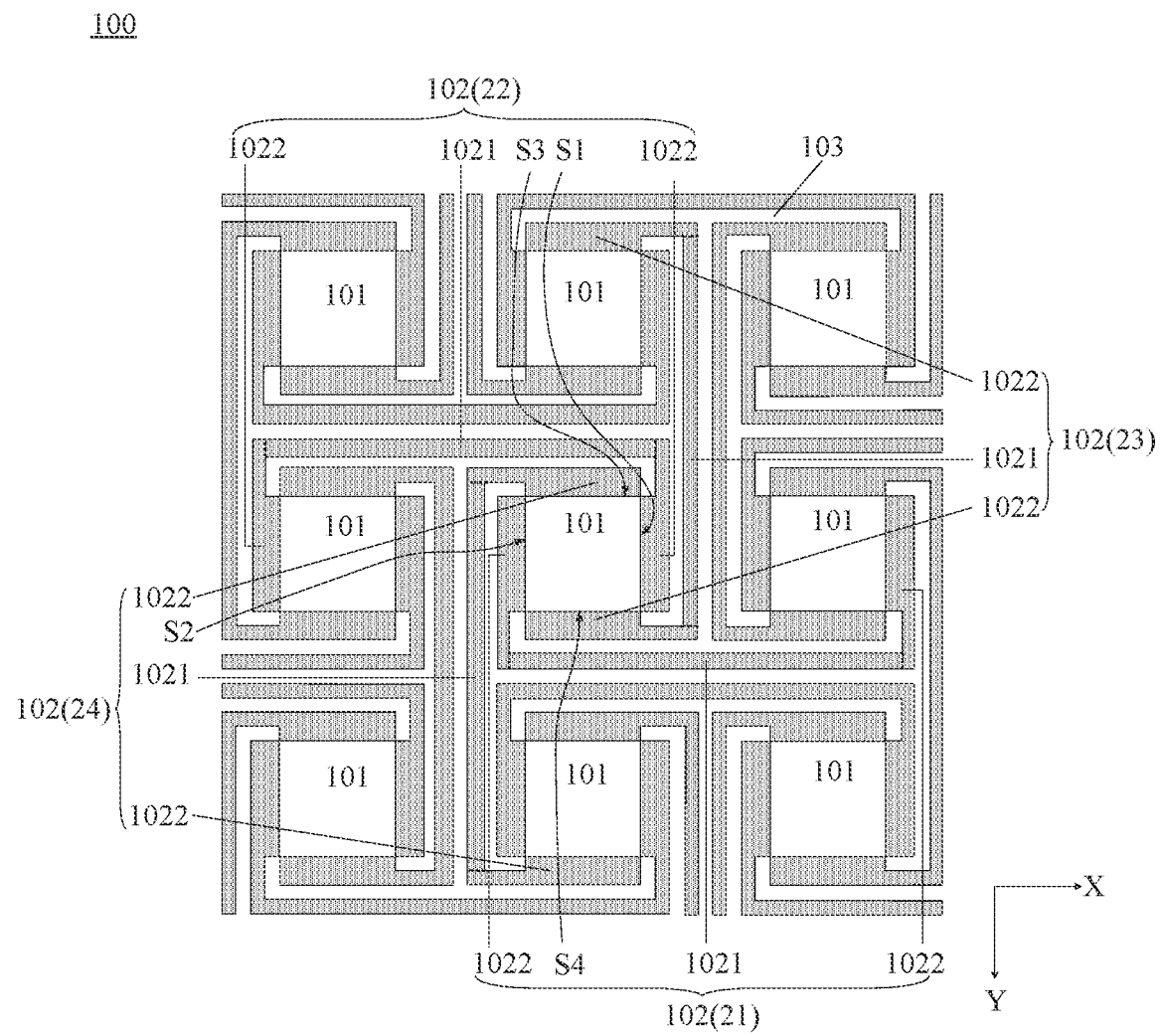
FIG. 2B is a schematic diagram showing a structure of another display substrate, in accordance with some embodiments of the present disclosure.

In some embodiments, the display panel includes a display substrate. As shown in FIGS. 2A and 2B, the display substrate 100 has a plurality of pixel island regions 101 arranged at intervals and a plurality of bridge regions 102 connecting the plurality of pixel island regions 101. An opening 103 is provided between any adjacent bridge regions 102.

At least one bridge region 102 of the plurality of bridge regions 102 includes a first region 1021 and two second regions 1022 located on two sides of the first region 1021. The two second regions 1022 are connected to two adjacent pixel island regions 101, respectively. For example, each bridge region 102 includes a first region 1021 and two second regions 1022 located on two sides of the first region 1021. The two second regions 1022 are connected to two adjacent pixel island regions 101.

In some embodiments, as shown in FIGS. 2A and 2B, the plurality of pixel island regions 101 are arranged in an array. That is, the plurality of pixel island regions 101 are arranged in a plurality of rows and a plurality of columns.

In some embodiments, as shown in FIGS. 2A and 2B, the plurality of bridge regions 102 are divided into a plurality of groups of bridge regions. Each group of bridge regions includes one first bridge region 21, one second bridge region 22, one third bridge region 23 and one fourth bridge region 24. That is, each group of bridge regions includes four bridge regions 102.

As shown in FIGS. 2A and 23, each pixel island region 101 is connected to one second region 1022 of one first bridge region 21, one second region 1022 of one second bridge region 22, one second region 1022 of one third bridge region 23, and one second region 1022 of one fourth bridge region 24 that are in one group of bridge regions. The second region 1022 in the first bridge region 21 and the second region 1022 in the second bridge region 22 are located on two opposite sides of the pixel island region 101 (for example, respectively located on a third side S3 and a fourth side S4 in FIG. 2A, or respectively located on a second side S2 and a first side S1 in FIG. 2B), and the second region 1022 in the third bridge region 23 and the second region 1022 in the fourth bridge region 24 are located on another two opposite sides of the pixel island region 101 (for example, respectively located on a second side S2 and a first side S1 in FIG. 2A, or respectively located on a fourth side S4 and a third side S3 in FIG. 2B).

As shown in FIGS. 2A and 2B, another second region 1022 in the first bridge region 21 is connected to one pixel island region 101 that is located on the side S1 of and adjacent to the pixel island region 101, another second region 1022 in the second bridge region 22 is connected to one pixel island region 101 that is located on the side S2 of and adjacent to the pixel island region 101. The pixel island region 101, the pixel island region 101 located on the side S1 of the pixel island region 101, and the pixel island region 101 located on the side S2 of the pixel island region 101 are located in the same row of pixel island regions 101. Another second region 1022 in the third bridge region 23 is connected to one pixel island region 101 that is located on the side S3 of and adjacent to the pixel island region 101, and another second region 1022 in the fourth bridge region 24 is connected to one pixel island region 101 that is located on the side S4 of and adjacent to the pixel island region 101. The pixel island region 101, the pixel island region 101 located on the side S3 of the pixel island region 101 and the pixel island region 101 located on the side S4 of the pixel island region 101 are located in the same column of pixel island regions 101.

In some examples, as shown in FIG. 2A, the second region 1022 in the first bridge region 21 and the second region 1022 in the second bridge region 22 that are connected to the pixel island region 101 are located on the two opposite sides (S3 and S4) of the pixel island region 101 in the column direction Y of the plurality of pixel island regions 101. The second region 1022 in the third bridge region 23 and the second region 1022 in the fourth bridge region 24 that are connected to the pixel island region 101 are located on the another two opposite sides (S2 and S1) of the pixel island region 101 in the row direction X of the plurality of pixel island regions 101.

In some other examples, as shown in FIG. 2B, the second region 1022 in the first bridge region 21 and the second region 1022 in the second bridge region 22 that are connected to the pixel island region 101 are located on the two opposite sides (S2 and S1) of the pixel island region 101 in the row direction X of the plurality of pixel island regions 101. The second region 1022 in the third bridge region 23 and the second region 1022 in the fourth bridge region 24 that are connected to the pixel island region 101 are located on the two opposite sides (S4 and S3) of the pixel island region 101 in the column direction Y of the plurality of pixel island regions 101.

Figure 3:
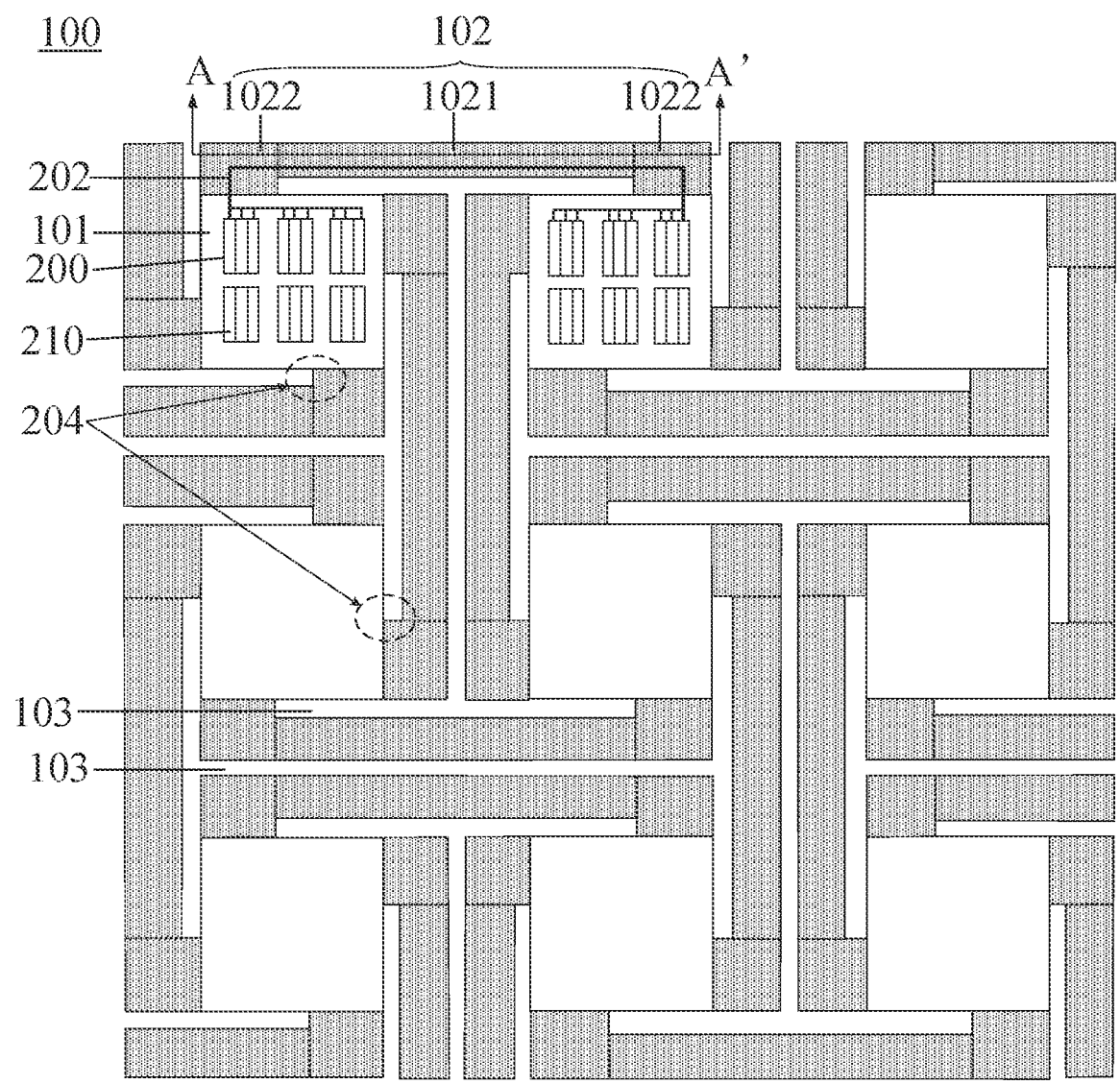
FIG. 3 is a schematic diagram showing a structure of yet another display substrate, in accordance with some embodiments of the present disclosure.

At least one pixel 200 is provided in the pixel island region 101, and all pixels 200 located in a plurality of pixel island regions 101 are configured for displaying an image. FIG. 3 is an illustration in which a plurality of pixels 200 are disposed in the pixel island region 101.

For example, as shown in FIG. 3, the pixel 200 may include a plurality of sub-pixels 210. The plurality of sub-pixels 210 include a first color sub-pixel, a second color sub-pixel and a third color sub-pixel. The first color, the second color, and the third color are three primary colors (such as red, green and blue, or cyan, yellow and magenta).

At least one signal line 202 is provided in the bridge region 102, and sub-pixels 210 located in adjacent pixel island regions 101 may realize signal input through the signal line 202 in the bridge region 102.

FIG. 3 only illustrate one signal line 202 located in the bridge region 102. In some examples, there may be a plurality of signal lines 202 in the bridge region 102. Arrangement manner of the plurality of signal lines 202 may be set according to a structure of the sub-pixels 210 in the pixel island region 101, which is not limited in the embodiments of the present disclosure.

On this basis, a stiffness of a portion of the display substrate 100 located in the first region 1021 is less than a stiffness of a portion of the display substrate 100 located in the second region 1022.

In a case where the display substrate 100 is applied to a display panel, when the display panel is stretched through an external force, a region of the bridge region 102 proximate to an end portion of the opening 103 is a stress concentration region (which is indicated by 204 in FIG. 3), and the stress concentration region is subjected to the greatest external force.

A stiffness of a display substrate at each position of a bridge region is substantially the same, which is easy to cause a portion of the display substrate located in a stress concentration region to be broken. As a result, it is possible to cause a signal line in the bridge region to be broken, and affect the normal use of a display panel.

In the display substrate 100 provided by some embodiments of the present disclosure, the bridge region 102 includes a first region 1021 and two second regions 1022 located on two sides of the first region 1021. The two second regions 1022 are connected to two adjacent pixel island regions 101, and the stiffness of the portion of the display substrate 100 located in the first region 1021 is less than the stiffnesses of the portions of the display substrate 100 located in the second regions 1022 that are located on the two sides of the first region 1021. Since the less the stiffness, the easier the deformation, compared to the second region 1022 that is closer to the end portion of the opening 103 (i.e., the stress concentration region), when the display panel including the display substrate 100 is stretched by external force, the first region 1021 is more easily deformed when subjected to a stretching force by setting the stiffness of the first region 1021 to be less than the stiffness of the second region 1022. As a result, the first region 1021 is subjected to more stress, which may effectively reduce a possibility of a fracture of the second region 1022.

Generally, a thickness of a material is proportional to a stiffness of the material. That is, the greater the thickness of the material, the greater the stiffness of the material. On this basis, in some embodiments, structures of the second region 1022 and the first region 1021 in the display substrate 100 need to meet the following condition for ensuring that the stiffness of the first region 1021 is less than the stiffness of the second region 1022: a thickness of the portion of the display substrate 100 located in the first region 1021 is less than a thickness of the portion of the display substrate 100 located in the second region 1022 in a thickness direction of the display substrate 100.

Figure 4:
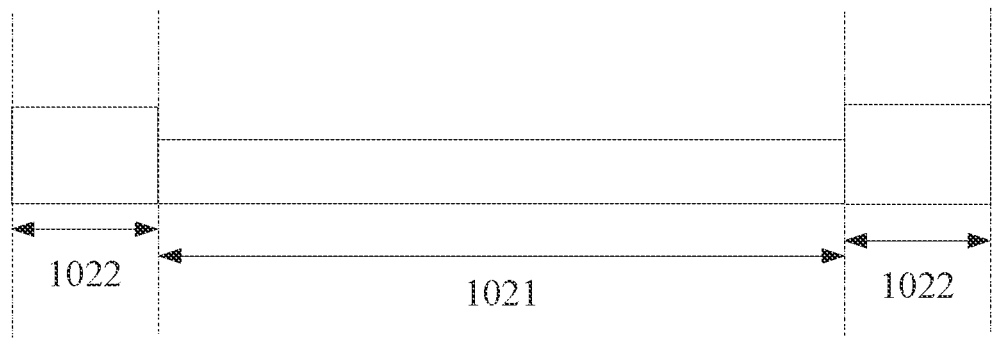
FIG. 4 is a schematic sectional diagram of the display substrate taken along the line A-A' in FIG. 3.

In some embodiments, as shown in FIG. 4, the thickness of the portion of the display substrate 100 located in the first region 1021 is less than the thickness of the portion of the display substrate 100 located in the second region 1022, the thickness of the portion of the display substrate 100 located in the first region 1021 is the same at each position, and the thickness of the portion of the display substrate 100 located in the second region 1022 is the same at each position.

Figure 5:
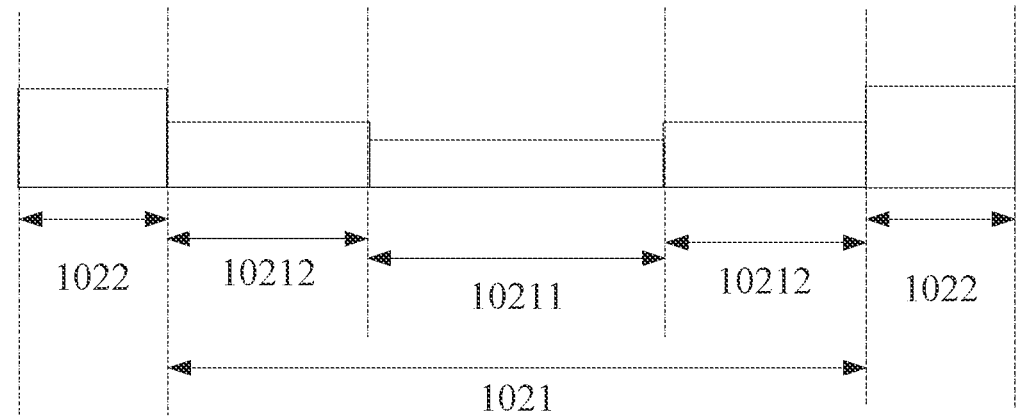
FIG. 5 is another schematic sectional diagram of the display substrate taken along the line A-A' in FIG. 3.

In some other embodiments, as shown in FIG. 5, the first region 1021 includes a middle sub-region 10211 and two edge sub-regions 10212 located on two sides of the middle sub-region 10211. The two edge sub-regions 10212 are connected to two second regions 1022 located on the two sides of the first region 1021, respectively. A thickness of a portion of the display substrate 100 located in the middle sub-region 10211 is less than a thickness of a portion of the display substrate 100 located in each edge sub-region 10212. The thickness of the portion of the display substrate 100 located in the edge sub-region 10212 is less than the thickness of the portion of the display substrate 100 located in the second region 1022.

Figure 6:
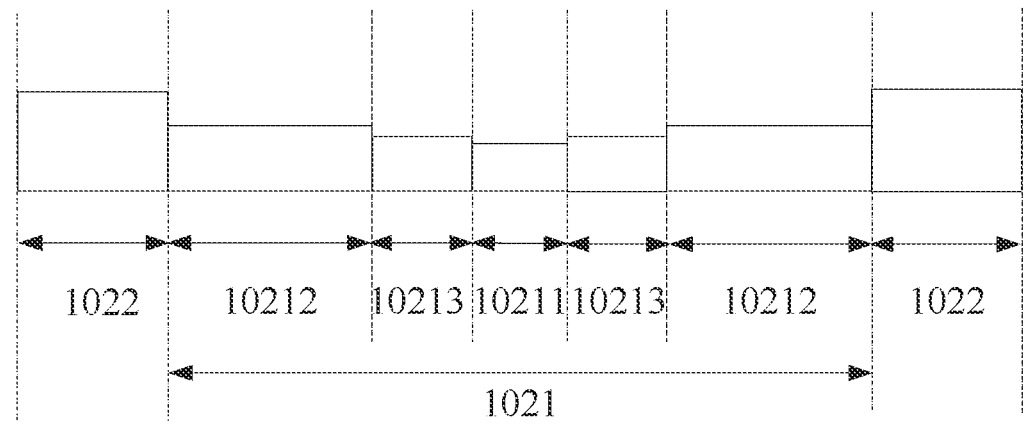
FIG. 6 is yet another schematic sectional diagram of the display substrate taken along the line A-A' in FIG. 3.
Figure 7:
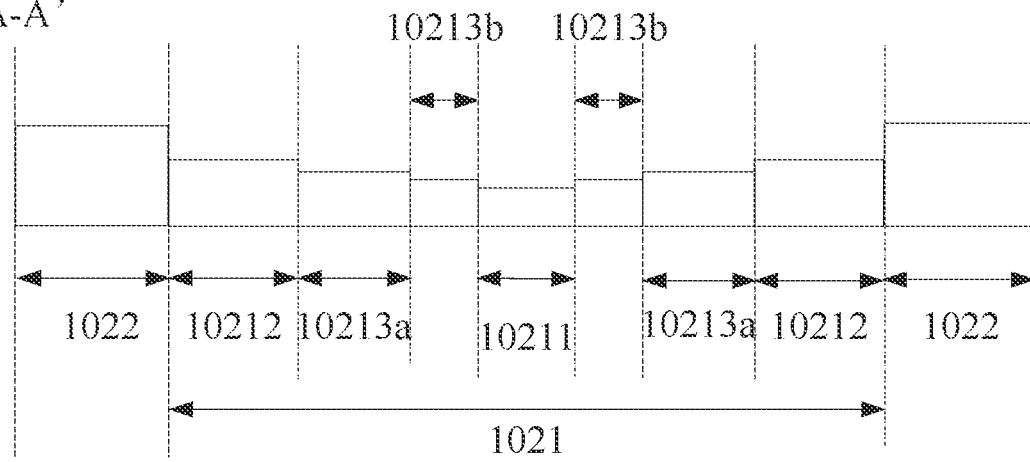
FIG. 7 is yet another schematic sectional diagram of the display substrate taken along the line A-A' in FIG. 3.

In some other embodiments, as shown in FIGS. 6 and 7, the first region 1021 further includes at least one transition sub-region 10213 located between the middle sub-region 10211 and the edge sub-region 10212. In all transition sub-regions 10213 and the edge sub-region 10212, thicknesses of portions of the display substrate 100 located in sub-regions increase sequentially in a direction from the middle sub-region 10211 to the edge sub-region 10212.

In some examples, as shown in FIG. 6, there is one transition sub-region 10213 disposed between the middle sub-region 10211 and the edge sub-region 10212. The thickness of the portion of the display substrate 100 located in the middle sub-region 10211 is less than a thickness of a portion of the display substrate 100 located in the transition sub-region 10213, and the thickness of the portion of the display substrate 100 located in the transition sub-region 10213 is less than the thickness of the portion of the display substrate 100 located in the edge sub-region 10212.

In some other examples, as shown in FIG. 7, there are two transition sub-regions 10213 disposed between the middle sub-region 10211 and the edge sub-region 10212, one transition sub-region 10213 proximate to the edge sub-region 10212 is referred to as a first transition sub-region 10213a, and the other transition sub-region 10213 proximate to the middle sub-region 10211 is referred to as a second transition sub-region 10213b. A thickness of a portion of the display substrate 100 located in the first transition sub-region 10213a is greater than a thickness of a portion of the display substrate 100 located in the second transition sub-region 10213b. The thickness of the portion of the display substrate 100 located in the edge sub-region 10212 is greater than the thickness of the portion of the display substrate 100 located in the first transition sub-region 10213a, and the thickness of the portion of the display substrate 100 located in the second transition sub-region 10213b is greater than the thickness of the portion of the display substrate 100 located in the middle sub-region 10211.

The some embodiments described above only exemplarily illustrate cases in which one or two transition sub-regions 10213 are disposed between the middle sub-region 10211 and the edge sub-region 10212. It can be understood that, there may be N (N is an integer greater than or equal to 3) transition sub-regions 10213 disposed between the middle sub-region 10211 and the edge sub-region 10212, and the embodiments of the present disclosure do not limit the number of the transition sub-regions 10213.

Figure 8:
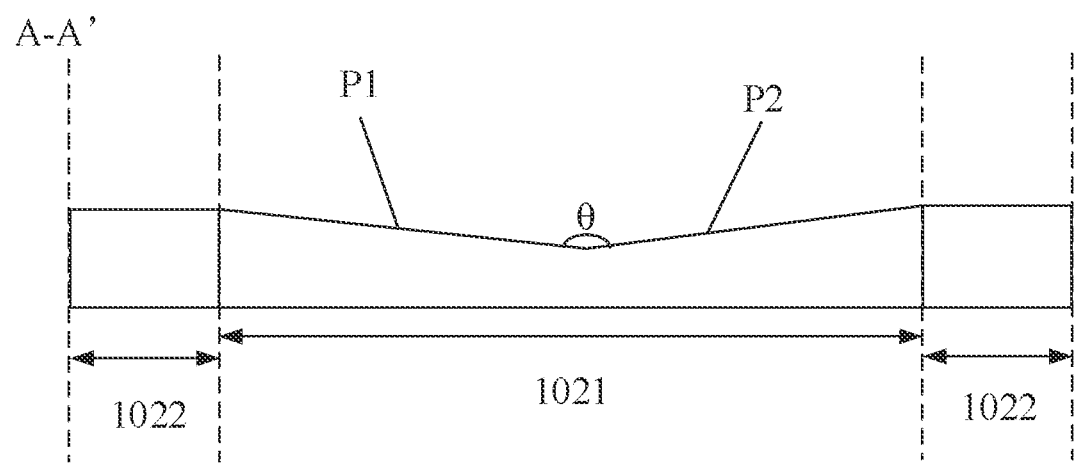
FIG. 8 is yet another schematic sectional diagram of the display substrate taken along the line A-A' in FIG. 3.
Figure 9:
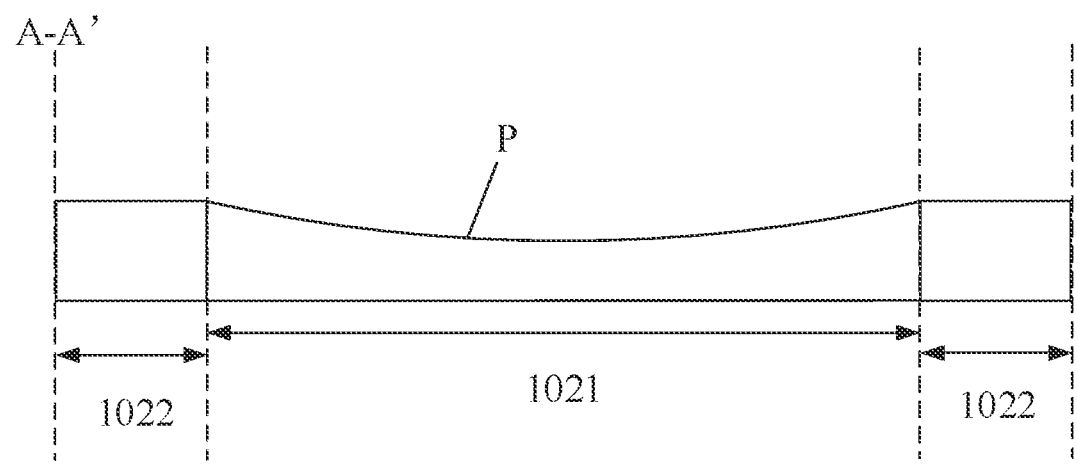
FIG. 9 is yet another schematic sectional diagram of the display substrate taken along the line A-A' in FIG. 3.

It can be understood that, as N approaches infinity, the thickness of first region 1021 may progressively increase in the direction from the middle sub-region 10211 to the edge sub-region 10212. For example, as shown in FIG. 8, a surface P of the display substrate 100 in the first region 1021 includes two inclined surfaces (P1 and P2) forming a predetermined included angle θ with each other. For another example, as shown in FIG. 9, the surface P of the display substrate 100 in the first region 1021 may be a curved surface.

Figure 10:
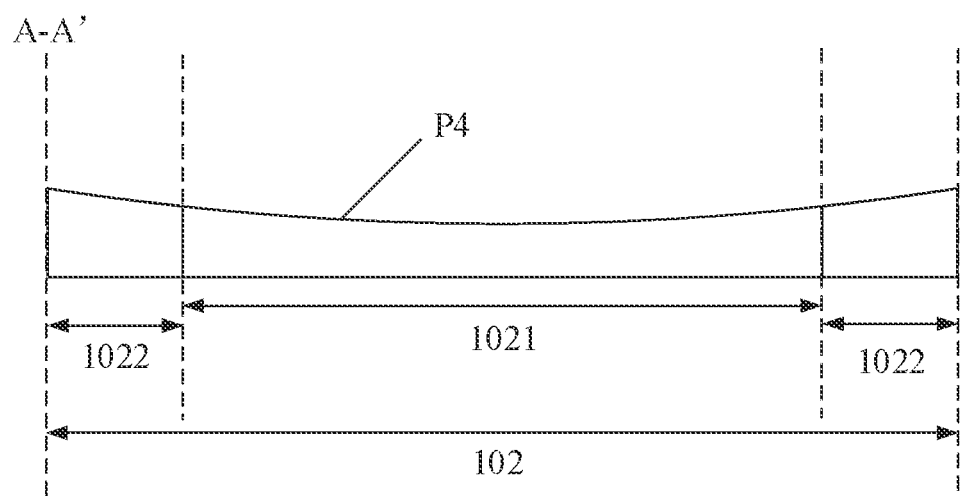
FIG. 10 is yet another schematic sectional diagram of the display substrate taken along the line A-A in FIG. 3.

It can be understood that, as shown in FIG. 10, a surface P4 of the display substrate 100 in the bridge region 102 may also be integrally formed as a curved surface.

In a direction from the middle sub-region 10211 to the edge sub-region 10212 in the bridge region 102, stress may be more dispersed to a middle of the first region 1021 by setting the portion of the display substrate 100 in the first region 1021 as a structure that is thin in the middle and thick in the two sides, which further reduces the possibility of the fracture in the second region 1022.

Figure 11:
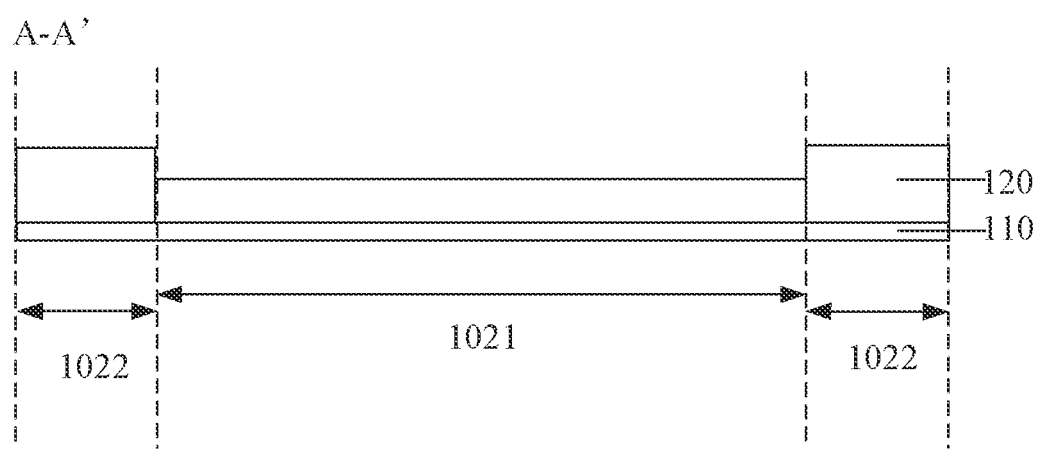
FIG. 11 is yet another schematic sectional diagram of the display substrate taken along the line A-A' in FIG. 3.

In some embodiments, as shown in FIG. 11, the display substrate 100 includes: a base 110 and an inorganic insulating layer 120 disposed on the base 110. A thickness of a portion of the inorganic insulating layer 120 located in the first region 1021 is less than a thickness of a portion of the inorganic insulating layer 120 located in the second region 1022.

Arrangement manners of the thickness of the portion of the inorganic insulating layer 120 located in the first region 1021 and the thickness of the portion of the inorganic insulating layer 120 located in the second region 1022 may be various.

Figure 12:
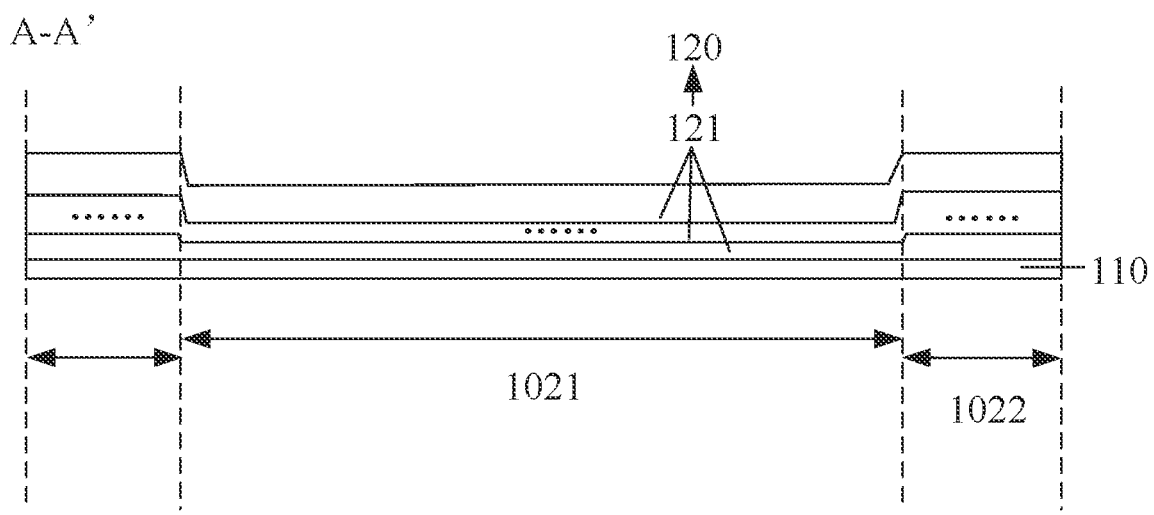
FIG. 12 is yet another schematic sectional diagram of the display substrate taken along the line A-A' in FIG. 3.

In some examples, as shown in FIG. 12, the inorganic insulating layer 120 includes a plurality of sub-insulating layers 121 stacked in a thickness direction of the base 110. For at least one sub-insulating layer 121 of the plurality of sub-insulating layers 121, a thickness of a portion of each sub-insulating layer 121 located in the first region 1021 is less than a thickness of a portion of the sub-insulating layer 121 located in the second region 1022. In this way, the thickness of the portion of the inorganic insulating layer 120 located in the first region 1021 is less than the thickness of the portion of the inorganic insulating layer 120 located in the second region 1022.

For example, in a process of manufacturing the display substrate, a thinning process may be performed on each inorganic film after a formation of the inorganic insulating film, so that a thickness of a portion of the inorganic insulating film located in the first region 1021 is less than a thickness of a portion located in the second region 1022. Then, the inorganic insulating film may be patterned to form one sub-insulating layer 121. Of course, it is also possible to directly obtain the sub-insulating layer 121 without patterning the inorganic insulating film.

Figure 13:
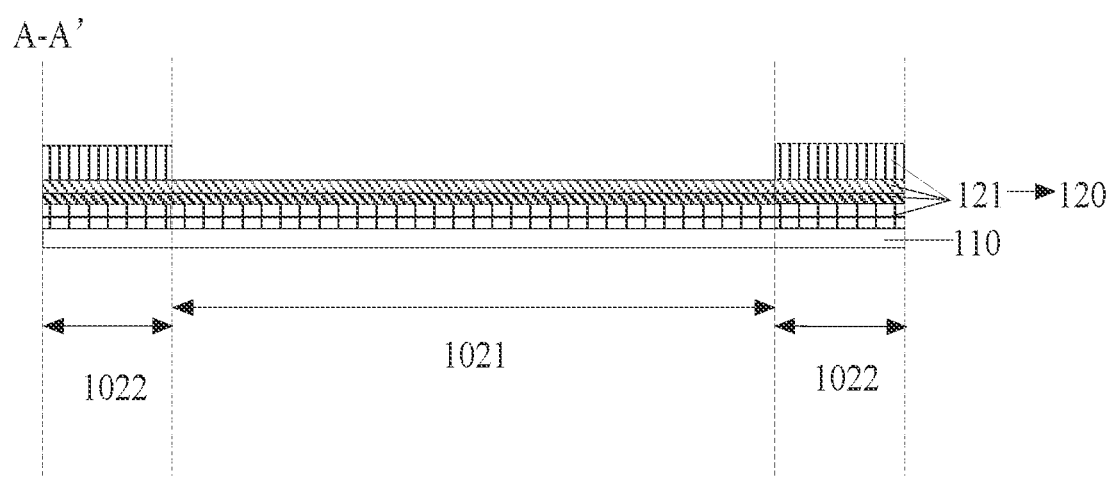
FIG. 13 is yet another schematic sectional diagram of the display substrate taken along the line A-A' in FIG. 3.
Figure 14:
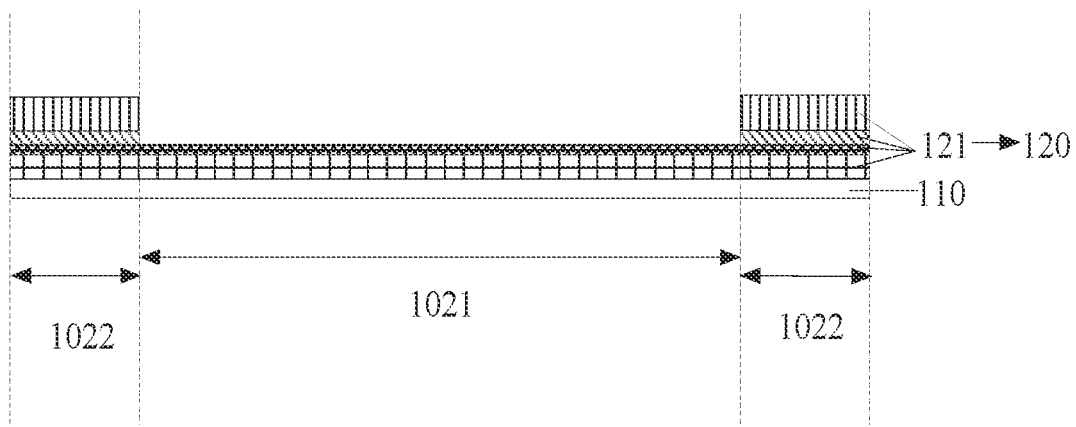
FIG. 14 is yet another schematic sectional diagram of the display substrate taken along the line A-A' in FIG. 3.
Figure 15:
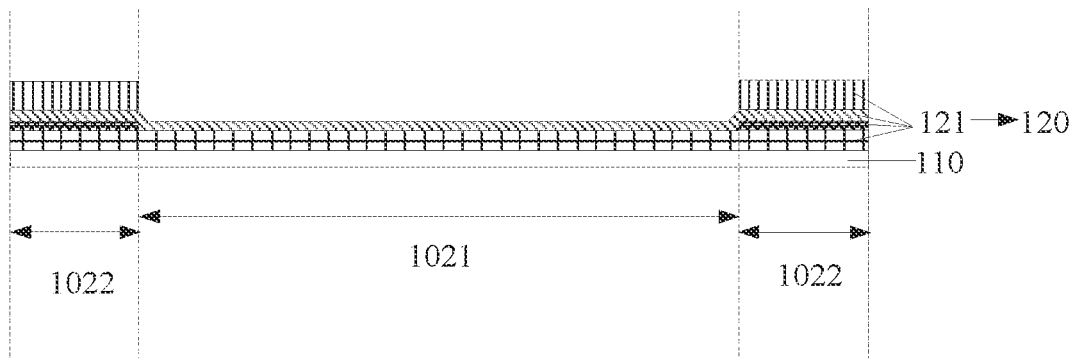
FIG. 15 is yet another schematic sectional diagram of the display substrate taken along the line A-A' in FIG. 3.

In some other examples, as shown in FIGS. 13 to 15, the inorganic insulating layer 120 includes a plurality of sub-insulating layers 121 stacked in the thickness direction of the base 110. For at least one sub-insulating layer 121 of the plurality of sub-insulating layers 121, an orthogonal projection of each sub-insulating layer 121 of the at least one sub-insulating layer 121 on the base 110 overlaps the second region 1022 and does not overlap the first region 1021. That is, for the at least one sub-insulating layer 121 of the plurality of sub-insulating layers 121 (e.g., one sub-insulating layer 121 in FIG. 13, or a plurality of sub-insulating layers 121 in FIGS. 14 and 15), the second region 1022 is provided with the at least one sub-insulating layer 121 therein, but the first region 1021 is not provided with the at least one sub-insulating layer 121 therein. Thus, the thickness of the at least one sub-insulating layer 121 of the plurality of sub-insulating layers 121 causes the thickness of the portion of the inorganic insulating layer 120 located in the first region 1021 to be less than the thickness of the portion of the inorganic insulating layer 120 located in the second region 1022.

Figure 16:
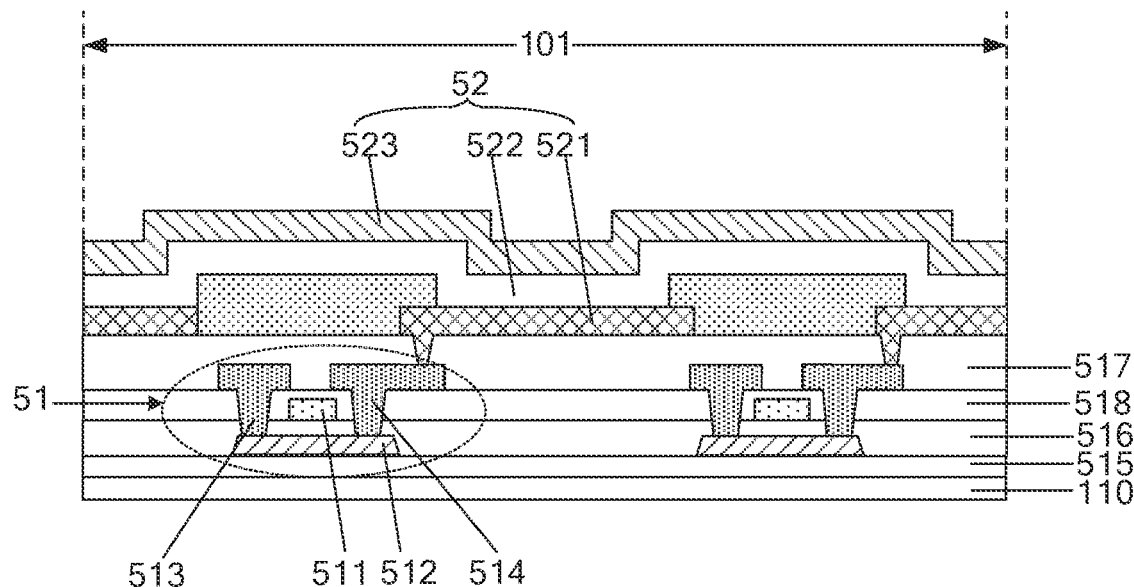
FIG. 16 is a schematic sectional diagram showing a structure of a display substrate, in accordance with some embodiments of the present disclosure.

In some embodiments, as shown in FIG. 16, the display substrate 100 further includes a plurality of pixel driving circuits disposed on the base 110 and located in the pixel island region 101. One pixel driving circuit of the plurality of pixel driving circuits includes a plurality of thin film transistors 51. For example, each pixel driving circuit includes a plurality of thin film transistors 51. One thin film transistor 51 of the plurality of thin film transistors 51 includes a gate 511, an active layer 512, a source 513, and a drain 514. For example, each thin film transistor 51 includes a gate 511, an active layer 512, a source 513, and a drain 514.

The plurality of sub-insulating layers 121 include at least two of a buffer layer, a gate insulating layer, and a passivation layer. As shown in FIG. 16, the buffer layer 515 is disposed between the gate 511 and the base 110, the gate insulating layer 516 is disposed between the gate 511 and the active layer 512, and the passivation layer 517 is disposed on a side of the source 513 and the drain 514 away from the base 110.

In some examples, the at least one sub-insulating layer 121 includes at least two of the buffer layer 515, the gate insulating layer 516, and the passivation layer 517. Since thicknesses of the buffer layer, gate insulating layer and passivation layer are relatively small, in a case where the at least one sub-insulating layer 121 includes at least two of the buffer layer, the gate insulating layer, and the passivation layer, a thickness difference between the second region 1022 and the first region 1021 may be made large. Therefore, the possibility of the fracture of the second region 1022 can be effectively reduced.

In some embodiments, as shown in FIG. 16, the gate 511 is disposed on a side of the active layer 512 away from the base 110. The plurality of sub-insulating layers 121 further include an interlayer dielectric layer 518, and the interlayer dielectric layer 518 is disposed between the gate 511, and the source 513 and the drain 514. In this case, the thin film transistor is a top-gate thin film transistor.

Of course, the thin film transistor may also be a bottom-gate thin film transistor. That is, the gate is disposed on a side of the active layer proximate to the base 110.

In some embodiments, at least one signal line 202 in the bridge region 102 includes a gate line and/or a data line connected to the pixel driving circuit 51.

Figure 17:
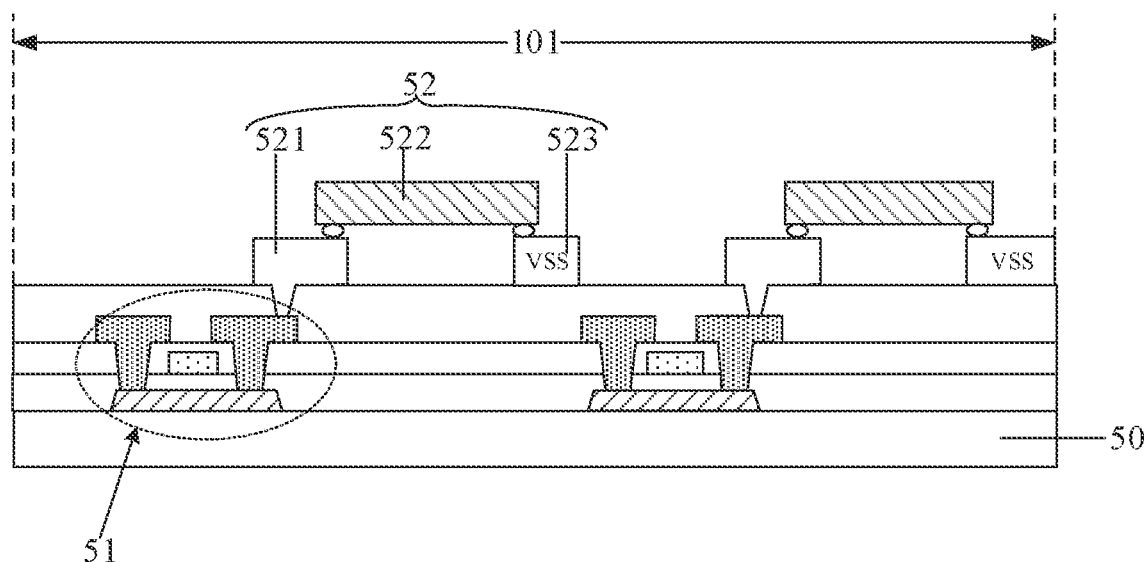
FIG. 17 is a schematic sectional diagram showing a structure of another display substrate, in accordance with some embodiments of the present disclosure.

In some embodiments, as shown in FIGS. 16 and 17, the display panel further includes: a plurality of light-emitting devices 52 disposed on the pixel island region 101. The light-emitting device 52 may include a first electrode 521, a light-emitting portion 522, and a second electrode 523.

In some examples, as shown in FIG. 16, the light-emitting device 52 is an QLED device. In this case, the first electrode 521 is an anode, the second electrode 523 is a cathode, and the light-emitting portion 522 is an organic light-emitting functional layer.

In other examples, as shown in FIG. 16, the light emitting device 52 is a QLED device. In this case, the first electrode 521 is a cathode, the second electrode 523 is an anode, and the light-emitting portion 522 is a quantum dot light-emitting functional layer.

In other examples, as shown in FIG. 17, the light-emitting device 52 is a Micro-LED device. In this case, the first electrode 521 is a cathode, the second electrode 523 is an anode (e.g., voltage source-to-source (VSS) electrode), and the light-emitting portion 522 is a Micro-LED unit.

In some examples, the one thin film transistor 51 of the plurality of thin film transistors in the pixel driving circuit is also a driving transistor, and one of the source and the drain of the driving transistor is electrically connected to the first electrode 521 of the light-emitting device 52.

In some examples, at least one signal line 202 further includes a connecting line, and the connecting line connects a plurality of second electrodes 523 disposed in the plurality of pixel driving circuits 51.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a plurality of pixel island regions arranged at intervals and a plurality of bridge regions connecting the plurality of pixel island regions, comprising
   an opening being disposed between any two adjacent bridge regions;
   at least one bridge region of the plurality of bridge regions including a first region and two second regions located on two sides of the first region, one second region of the two second regions being connected to one pixel island region adjacent thereto, and another region of the two second regions being connected to one pixel island region adjacent thereto; and
   a stiffness of a portion of the display substrate located in the first region being less than a stiffness of a portion of the display substrate located in each second region;
   wherein a thickness of the portion of the display substrate located in the first region is less than a thickness of the portion of the display substrate located in the second reion in a thickness direction of the display substrate;
   the first region includes a middle sub-region and two edge sub-regions located on two sides of the middle sub-region, one edge sub-region of the two edge sub-regions is connected to one second region, and another edge sub-region of the two edge sub-regions is connected to another second region,
   a thickness of a portion of the display substrate located in the middle sub-region is less than a thickness of a portion of the display substrate located in each edge sub-region; and
   the thickness of the portion of the display substrate located in the edge sub-region is less than the thickness of the portion of the display substrate located in the second region; and
   the first region further includes at least one transition sub-region located between the middle sub-region and the edge sub-region; and
   in all transition sub-regions and the e sub-region, thicknesses of portions of the display substrate located in sub-regions increase sequentially in a direction from the middle sub-region to the edge sub-region.

2. The display substrate according to claim 1, further comprising:
   a base; and
   an inorganic insulating layer disposed on the base,
   wherein a thickness of a portion of the inorganic insulating layer located in the first region is less than a thickness of a portion of the inorganic insulating layer located in the second region.

3. The display substrate according to claim 2, wherein the inorganic insulating layer includes a plurality of sub-insulating layers stacked in a thickness direction of the base; and
   in at least one sub-insulating layer of the plurality of sub-insulating layers, a thickness of a portion of each sub-insulating layer located in the first region is less than a thickness of a portion of the sub-insulating layer located in the second region.

4. The display substrate according to claim 3, further comprising:
   a plurality of pixel driving circuits disposed on the base and located in a pixel island region of the plurality of the pixel island regions, a pixel driving circuit of the plurality of pixel driving circuits including a plurality of thin film transistors, and a thin film transistor of the plurality of thin film transistors including a gate, an active layer, a source, and a drain;

wherein the plurality of sub-insulating layers include a buffer layer, a gate insulating layer and a passivation layer; and the buffer layer is disposed between the gate and the base, the gate insulating layer is disposed between the gate and the active layer, and the passivation layer is disposed on a side of the source and the drain away from the base.

5. The display substrate according to claim 4, wherein the gate is disposed on a side of the active layer away from the base; and
the plurality of sub-insulating layers further include an interlayer dielectric layer, and the interlayer dielectric layer is disposed a side of the gate away from the active layer.

6. The display substrate according to claim 2, wherein the inorganic insulating layer includes a plurality of sub-insulating layers stacked in a thickness direction of the base; and
in at least one sub-insulating layer of the plurality of sub-insulating layers, an orthogonal projection of each sub-insulating layer on the base overlaps the second region and does not overlap the first region.

7. The display substrate according to claim 6, further comprising:
a plurality of pixel driving circuits disposed on the base and located in a pixel island region of the plurality of the pixel island regions, a pixel driving circuit of the plurality of pixel driving circuits including a plurality of thin film transistors, and a thin film transistor of the plurality of thin film transistors including a gate, an active layer, a source, and a drain;
wherein the plurality of sub-insulating layers include a buffer layer, a gate insulating layer and a passivation layer; and
the buffer layer is disposed between the gate and the base, the gate insulating layer is disposed between the gate and the active layer, and the passivation layer is disposed on a side of the source and the drain away from the base.

8. The display substrate according to claim 7, wherein the gate is disposed on a side of the active layer away from the base; and
the plurality of sub-insulating layers further include an interlayer dielectric layer, and the interlayer dielectric layer is disposed a side of the gate away from the active layer.

9. The display substrate according to claim 1, further comprising:
at least one signal line disposed in the bridge region, the at least one signal line including a gate line and/or a data line.

10. The display substrate according to claim 1, wherein the plurality of pixel island regions are arranged in an array;
the plurality of bridge regions are divided into a plurality of groups of bridge regions, and each group of bridge regions includes one first bridge region, one second bridge region, one third bridge region, and one fourth bridge region;
each pixel island region is connected to one second region in a first bridge region, one second region in a second bridge region, one second region in a third bridge region, and one second region in a fourth bridge region that are in one group of bridge regions, the second region in the first bridge region and the second region in the second bridge region are located on two opposite sides of the pixel island region, and the second region in the third bridge region and the second region in the fourth bridge region are located on another two opposite sides of the pixel island region;
another second region in the first bridge region is connected to one pixel island region that is located on a first side of the four sides of and adjacent to the pixel island region, another second region in the second bridge region is connected to one pixel island region that is located on a second side of the four sides of and adjacent to the pixel island region, and the pixel island region, the pixel island region located on the first side of the pixel island region, and the pixel island region located on the second side of the pixel island region are located in a same row of pixel island regions; and
another second region in the third bridge region is connected to one pixel island region that is located on a third side of the four side of and adjacent to the pixel island region, another second region in the fourth bridge region is connected to one pixel island region that is located on a fourth side of the four side of and adjacent to the pixel island region, and the pixel island region, the pixel island region located on the third side of the pixel island region, and the pixel island region located on the fourth side of the pixel island region are located in a same column of pixel island regions.

11. The display substrate according to claim 10, wherein the second region in the first bridge region and the second region in the second bridge region that are in the group of bridge regions are located on the third side and the fourth side of the pixel island region in a column direction of the plurality of pixel island regions, respectively; and
the second region in the third bridge region and the second region in the fourth bridge region that are in the group of bridge regions are located on the second side and the first side of the pixel island region in a row direction of the plurality of pixel island regions, respectively.

12. The display substrate according to claim 10, wherein the second region in the first bridge region and the second region in the second bridge region that are in the group of bridge regions are located on the second side and the first side of the pixel island region in a row direction of the plurality of pixel island regions, respectively; and
the second region in the third bridge region and the second region in the fourth bridge region that are in the group of bridge regions are located on the fourth side and the third side of the pixel island region in a column direction of the plurality of pixel island regions, respectively.

13. A display panel, comprising the display substrate according to claim 1 and a plurality of light-emitting devices disposed in each pixel island region.

14. The display panel according to claim 13, wherein each light-emitting device includes any one of an organic light-emitting diode (OLED) device, a quantum dot light-emitting diode (QLED) device, and a Micro light-emitting device.

15. A display apparatus, comprising the display panel according to claim 13.

16. The display substrate according to claim 1, wherein a surface of the display substrate in the first region includes two inclined surfaces forming an included angle with each other, or a surface of the display substrate in the first region is a curved surface.

17. The display panel substrate according to claim 1, wherein a surface of the display substrate in the bridge region is a curved surface.

* * * * *